(12) United States Patent
Hatsukawa

(10) Patent No.: US 8,551,864 B2
(45) Date of Patent: Oct. 8, 2013

(54) METHOD OF MANUFACTURING SEMICONDUCTOR DEVICE

(75) Inventor: Satoshi Hatsukawa, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/427,612

(22) Filed: Mar. 22, 2012

(65) Prior Publication Data

US 2012/0244680 A1    Sep. 27, 2012

Related U.S. Application Data

(60) Provisional application No. 61/467,682, filed on Mar. 25, 2011.

(30) Foreign Application Priority Data

Mar. 25, 2011 (JP) .................. P2011-067143

(51) Int. Cl.
*H01L 21/00*    (2006.01)
(52) U.S. Cl.
USPC .......................................... 438/462; 438/463

(58) Field of Classification Search
USPC .................................................. 438/462, 463
See application file for complete search history.

(56) References Cited

U.S. PATENT DOCUMENTS

2008/0070380 A1* 3/2008 Kusunoki ...................... 438/462

FOREIGN PATENT DOCUMENTS

JP    2006-128191 A    5/2006

* cited by examiner

*Primary Examiner* — Long K Tran
(74) *Attorney, Agent, or Firm* — Venable LLP; Michael A. Sartori; Tamatane J. Aga

(57) ABSTRACT

A method of manufacturing a semiconductor device comprises the steps of forming a film on a main face of a semiconductor substrate having a plurality of device forming regions for forming semiconductor devices, the film having a coefficient of thermal expansion different from that of the semiconductor substrate and including a cutout on a region between the plurality of device forming regions; forming the semiconductor devices in the respective device forming regions by using the film; and dividing the semiconductor substrate into the respective device forming regions.

6 Claims, 8 Drawing Sheets

Fig.4
(A)
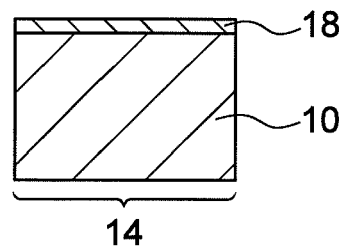
(B)
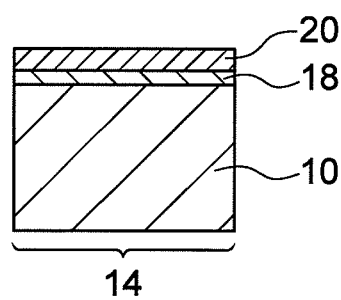
(C)
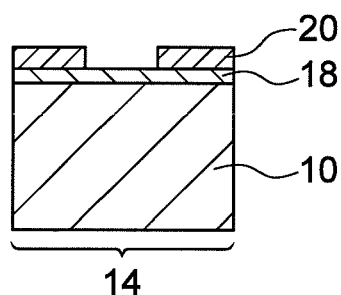
(D)
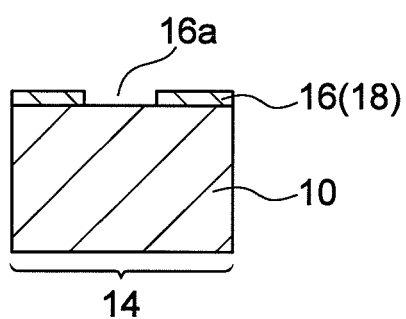

Fig.6
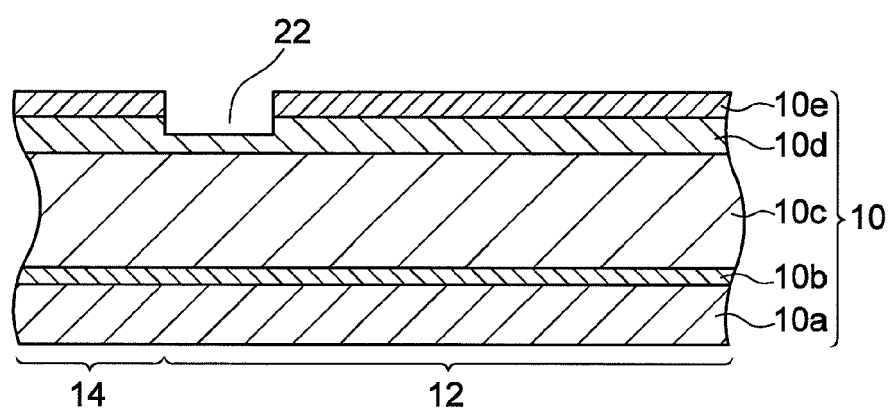
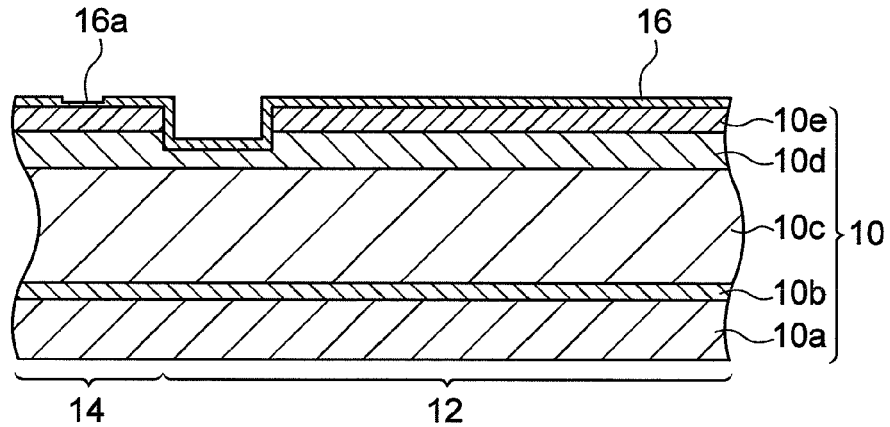

METHOD OF MANUFACTURING SEMICONDUCTOR DEVICE

CROSS-REFERENCE RELATED APPLICATIONS

This application claims priority to Provisional Application Ser. No. 61/467,682 filed on Mar. 25, 2011 and claims the benefit of Japanese Patent Application No. 2011-067143, filed Mar. 25, 2011, all of which are incorporated herein by reference in their entirety.

BACKGROUND OF THE INVENTION

1. Field of the Invention

The present invention relates to a method of manufacturing a semiconductor device.

2. Related Background Art

In the manufacturing of semiconductor devices, there is a step of implanting ions through a mask member into or forming wiring onto a predetermined region of a semiconductor substrate. For this step, a film to become the mask member or wiring is formed on the semiconductor substrate. In Japanese Patent Application Laid-Open No. 2006-128191, for example, a film made of polycrystal Si to become a mask member for ion implantation is formed, and the mask member is produced by utilizing photolithography and reactive ion etching (RIE) or the like.

SUMMARY OF THE INVENTION

However, the film to become the mask member for ion implantation or the film for forming the wiring may have a coefficient of thermal expansion different from that of the semiconductor substrate. The inventors have found that the semiconductor substrate will deflect in this case if the film and the semiconductor substrate are cooled to about room temperature after the film is deposited by sputtering or chemical vapor deposition such as plasma CVD. Thus deflecting the semiconductor substrate lowers the accuracy in patterning the film for using it as a mask member, for example. This will worsen performances of the semiconductor substrate to be made.

It is therefore an object of the present invention to provide a method of manufacturing a semiconductor device which can suppress deflections of the semiconductor substrate caused by the forming of a film during the manufacturing process.

The method of manufacturing a semiconductor device in accordance with one aspect of the present invention comprises the steps of (A) forming a film on a main face of a semiconductor substrate having a plurality of device forming regions for forming semiconductor devices, the film having a coefficient of thermal expansion different from that of the semiconductor substrate and including a cutout on a region between the plurality of device forming regions; (B) forming the semiconductor devices in the respective device forming regions by using the film; and (C) dividing the semiconductor substrate into the respective device forming regions.

In this method, a film formed with a cutout on a region between device forming regions is disposed on a semiconductor substrate. Even when the film has a coefficient of thermal expansion different from that of the semiconductor substrate, forming the film with the cutout suppresses stresses occurring in the film because of the difference in coefficient of thermal expansion. As a result, the deflections of the semiconductor substrate caused by the forming of the film are suppressed.

In one embodiment, the step of dividing the semiconductor substrate into the respective device forming regions may use an area between the adjacent device forming regions as a dicing area so as to dice the semiconductor device into the respective device forming regions, the cutout being formed along the dicing area. Since the cutout is formed in the dicing area on the outside of the device forming regions, the semiconductor substrate can effectively be utilized for forming the semiconductor devices in this case.

In one embodiment, the cutout may be located on the dicing area, the cutout having a width smaller than that of the dicing area in a cross section orthogonal to an extending direction of the dicing area. When implanting ions into the semiconductor substrate while using the film as a mask for ion implantation, for example, this mode inhibits the ions from being implanted into unnecessary regions through the cutout.

In one embodiment, the cutout may penetrate through the film in a thickness direction thereof. This makes it easier to control the cutout in its depth direction when forming the same. Stresses occurring in the film can also become less.

In one embodiment, the cutout may have a length in a depth direction thereof smaller than a thickness of the film. This can shorten the time required for forming the cutout.

In one embodiment, the film may be a film to become a mask member for implanting an ion into the semiconductor substrate.

In one embodiment, the step of forming the film may have the steps of depositing the film on the main face of the semiconductor substrate and forming the cutout in the deposited film.

As described above, a method of manufacturing a semiconductor device which can suppress deflections of the semiconductor substrate caused by the forming of a film during the manufacturing process is provided.

BRIEF DESCRIPTION OF THE DRAWINGS

FIG. 4 is a set of diagrams illustrating an example of steps of forming a film having a cutout on the semiconductor substrate represented in FIG. 1;

FIG. 6 is a set of diagrams illustrating an example of steps of manufacturing a semiconductor device;

DESCRIPTION OF THE PREFERRED EMBODIMENTS

Figure 1:
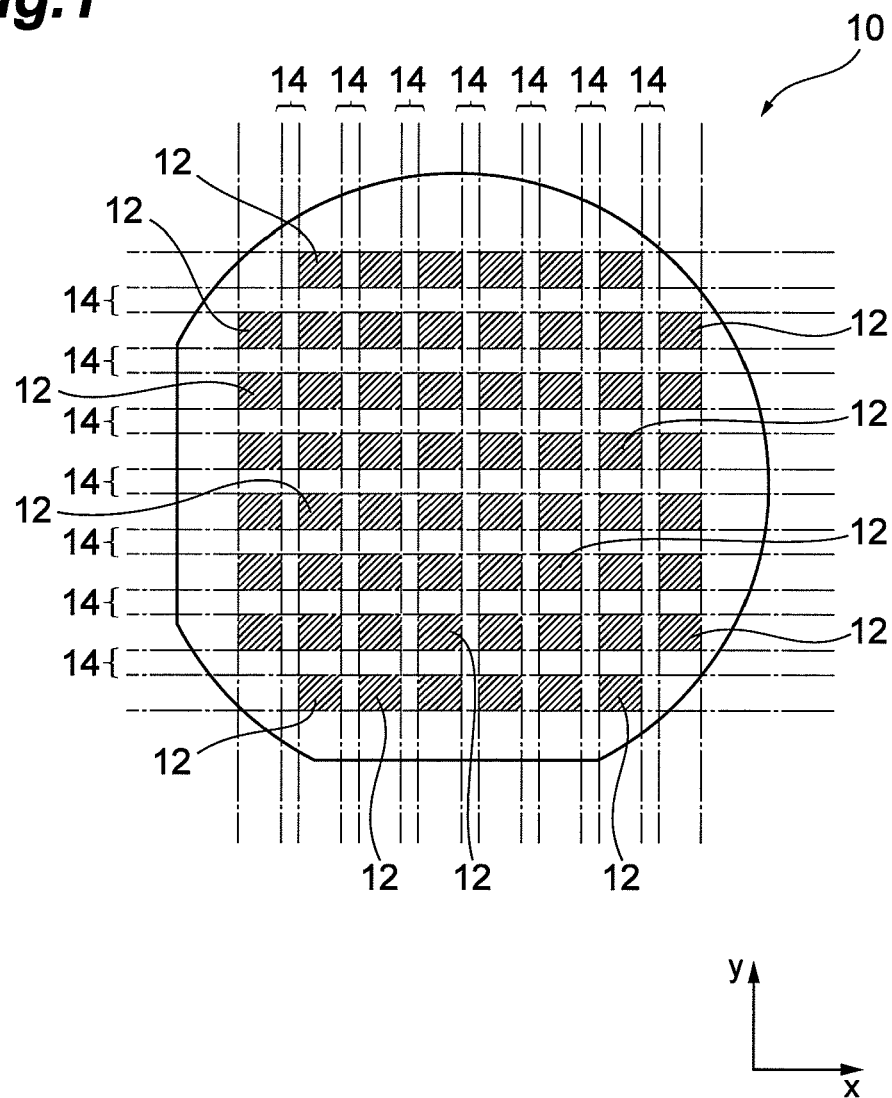
FIG. 1 is a plan view of a semiconductor substrate for manufacturing a semiconductor device in accordance with an embodiment.

In the following, embodiments of the present invention will be explained with reference to the drawings. In the explanation of the drawings, the same constituents will be referred to with the same signs while omitting their overlapping descriptions. Proportions in the drawings do not always coincide with those explained.

Figure 2:
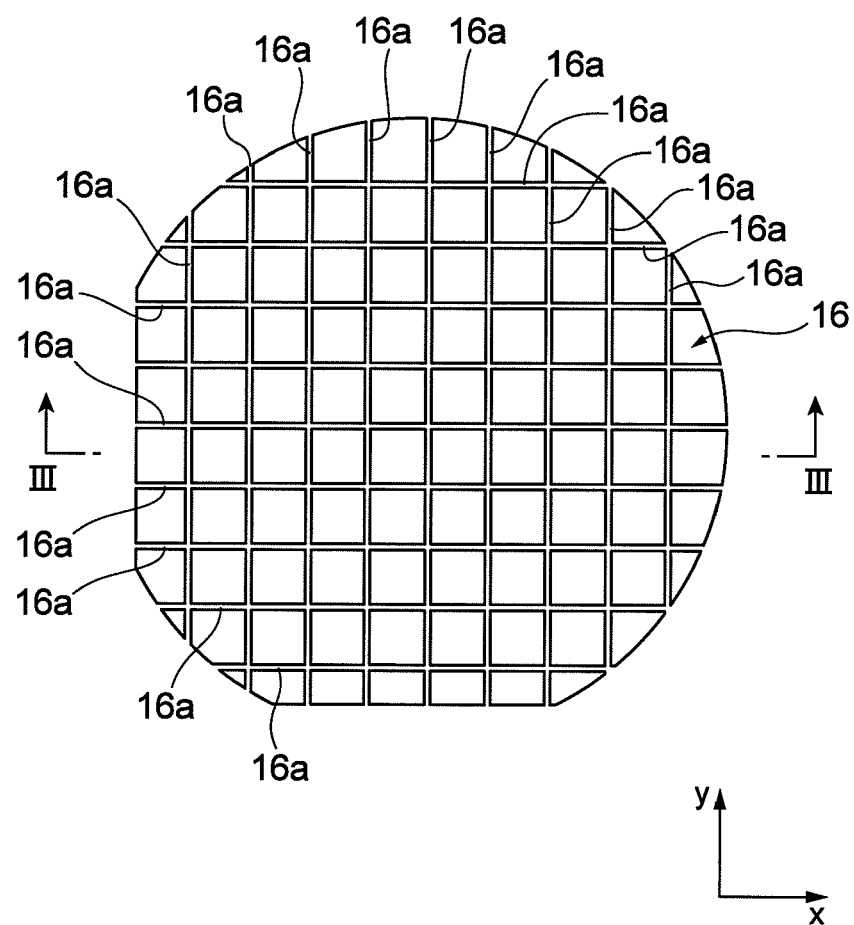
FIG. 2 is a diagram illustrating one step in a process of manufacturing a semiconductor device utilizing the semiconductor substrate represented in FIG. 1.
Figure 3:
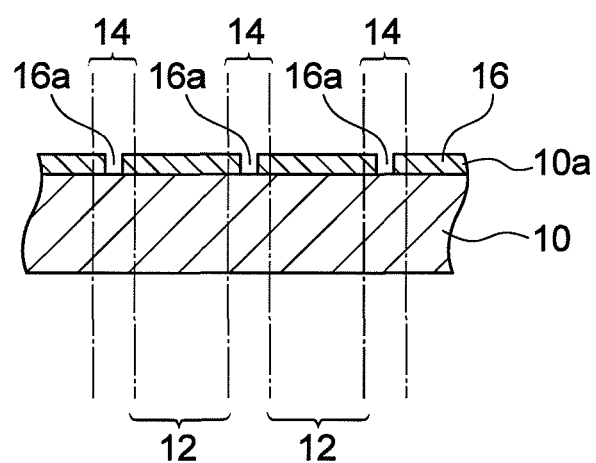
FIG. 3 is a partly enlarged view of an end face taken along the line III-III of FIG. 2.

With reference to FIGS. 1 to 4, the method of manufacturing a semiconductor device in accordance with an embodiment will be explained schematically. FIG. 1 is a plan view of a semiconductor substrate for manufacturing a semiconductor device. FIG. 2 is a diagram illustrating one step in a process of manufacturing a semiconductor device. FIG. 3 is a partly enlarged view of an end face taken along the line III-III of FIG. 2. FIG. 4 is a set of diagrams illustrating an example of steps of forming a film having a cutout on the semiconductor substrate represented in FIG. 1. For convenience of explanation, two directions orthogonal to each other within a plane orthogonal to the thickness direction of a semiconductor substrate 10 will hereinafter be referred to as x and y directions as illustrated in FIGS. 1 and 2.

First, when manufacturing a semiconductor device, the semiconductor substrate 10 substantially shaped like a disk as illustrated in FIG. 1 is prepared. Examples of the semiconductor substrate 10 include SiC and GaN substrates. The semiconductor substrate 10 has a diameter of 2 to 4 inches, for example. The semiconductor substrate 10 may have a thickness which is typically used for semiconductor devices such as transistors and diodes. The thickness of the semiconductor substrate 10 is about 400 μm, for example.

When manufacturing a semiconductor device, semiconductor devices are formed in a plurality of predetermined regions of the semiconductor substrate 10. In this specification, the predetermined regions where semiconductor devices are manufactured in the semiconductor substrate 10 will be referred to as device forming regions 12. The device forming region 12 is regions known as so-called "die." For convenience of explanation, FIG. 1 hatches the device forming regions 12. When seen as a plane, each device forming region 12 has a quadrangular form, for example. Examples of the quadrangular form include rectangular and square forms. One side of the device forming region 12 has a length of 1.5 to 3.0 mm, for example.

Typically, a plurality of device forming regions 12 are arranged in each of the x and y directions as illustrated in FIG. 1. Regions between the adjacent device forming regions 12 are linear dicing areas 14 or dicing lines for dividing the semiconductor substrate 10 into the semiconductor devices by dicing after forming the semiconductor devices in the adjacent device forming regions 12. In other words, the regions surrounded by the dicing areas 14 for dicing after forming the semiconductor devices in the semiconductor substrate 10 are the device forming regions 12. The dash-single-dot lines in FIG. 1 virtually indicate boundaries of the dicing areas 14. The width of the dicing areas 14 is typically 100 μm, but may be 10 μm or 50 μm, for example.

Next, as illustrated in FIGS. 2 and 3, a mask film 16 to become a mask member for ion implantation is formed on a front face (main face) 10a of the semiconductor substrate 10 (film forming step). The mask film 16 formed in this step is provided with cutouts 16a. The mask film 16 is a thin film having a thickness smaller than that of the semiconductor substrate 10. By the thickness of the mask film 16 is meant the thickness of its region free of the cutouts 16a.

Examples of materials for the mask film 16 include $SiO_2$, tungsten, silicon nitride, polysilicon, molybdenum, tantalum, tantalum carbide, aluminum, and nickel. The mask film 16 has a coefficient of thermal expansion different from that of the semiconductor substrate 10, since they are made of materials different from each other. A method of forming the mask film 16 provided with the cutouts 16a will now be explained with reference to FIG. 4. FIG. 4 is a set of diagrams illustrating an example of steps of forming the film 16 having the cutouts 16a on the semiconductor substrate 10. FIG. 4 illustrates a region of the dicing area 14 in the semiconductor substrate 10.

(1) As illustrated in FIG. 4(A), a film 18 to become the mask film 16 is deposited on the semiconductor substrate 10. This film 18 can be deposited by chemical vapor deposition such as plasma CVD or ion sputtering.

(2) The linear cutouts 16a extending along the extending directions of the dicing areas 14 are formed in regions on the dicing areas 14 in thus deposited film 18. The cutouts 16a can be formed as follows, for example.

(2a) As illustrated in FIG. 4(B), a resist film 20 is laid on the film 18.

(2b) Subsequently, as illustrated in FIG. 4(C), the resist film 20 is patterned according to the pattern of cutouts 16a to be formed. The patterning can be performed by employing a contact aligner, for example.

(2c) Thereafter, as illustrated in FIG. 4(D), the cutouts 16a are formed in the film 18 while using the patterned resist film 20 as a mask member, and then the resist film 20 is removed, so as to leave the mask film 16. An example of methods for forming the cutouts 16a is ion etching such as RIE dry etching.

The thickness of the mask film 16 is 10 μm, for example. The mask film 16 may have a thickness of 100 nm or greater. This is because the thickness of 100 nm or greater can inhibit ions from being implanted into unnecessary regions at the time of ion implantation.

In one embodiment, the cutout 16a has a width W1 smaller than a width W2 of the dicing area 14 in a cross section orthogonal to the extending direction of the cutout 16a. The width of the cutout 16a is 10 to 50 μm, for example.

In one embodiment, the cutouts 16a may penetrate through the mask film 16 as illustrated in FIG. 3. The cutouts 16a may further cut out the front face of the semiconductor substrate 10. When penetrating through the mask film 16, the cutouts 16a may be controlled with low accuracy in its depth direction and thus can be formed easily.

Figure 5:
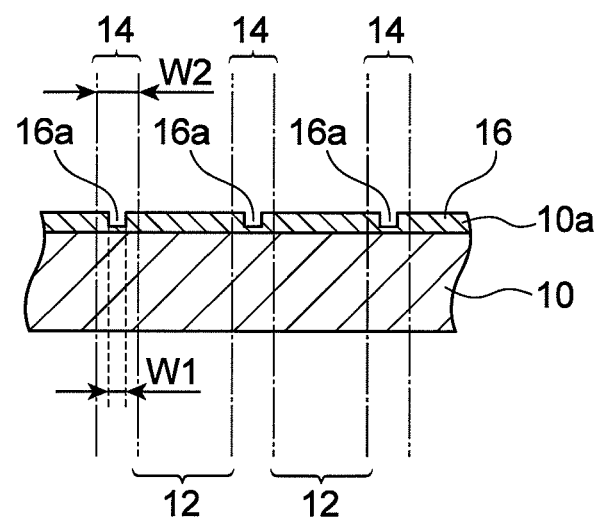
FIG. 5 is a diagram illustrating another example of the cutout.

In one embodiment, as illustrated in FIG. 5, the cutouts 16a may have a length in the depth direction smaller than the thickness of the mask film 16. That is, the cutouts 16a may be kept from penetrating through the mask film 16. In one embodiment, the cutouts 16a extending in one of the x and y directions illustrated in FIG. 2 may be formed alone. In one embodiment, the cutouts 16a may not be formed throughout the one-directionally extending dicing area 14 in the extending direction thereof but in a part thereof.

In the making of the semiconductor device, after forming the mask film 16 having the cutouts 16a as mentioned above, the semiconductor device is formed (semiconductor device forming step) through a process of implanting ions at predetermined positions within each device forming region 12 by using the mask film 16 and the like. Subsequently, the semiconductor substrate 10 is diced along the dicing areas 14, so as to separate the device forming regions 12 from each other, thereby yielding the semiconductor devices (separation step). Examples of the semiconductor devices that can be manufactured include transistors and diodes.

Next, with reference to FIGS. 6 to 8, a method of manufacturing a semiconductor device in the case of manufacturing a RESURF (reduced surface field) junction field transistor (JFET) as the semiconductor device will be explained.

Figure 7:
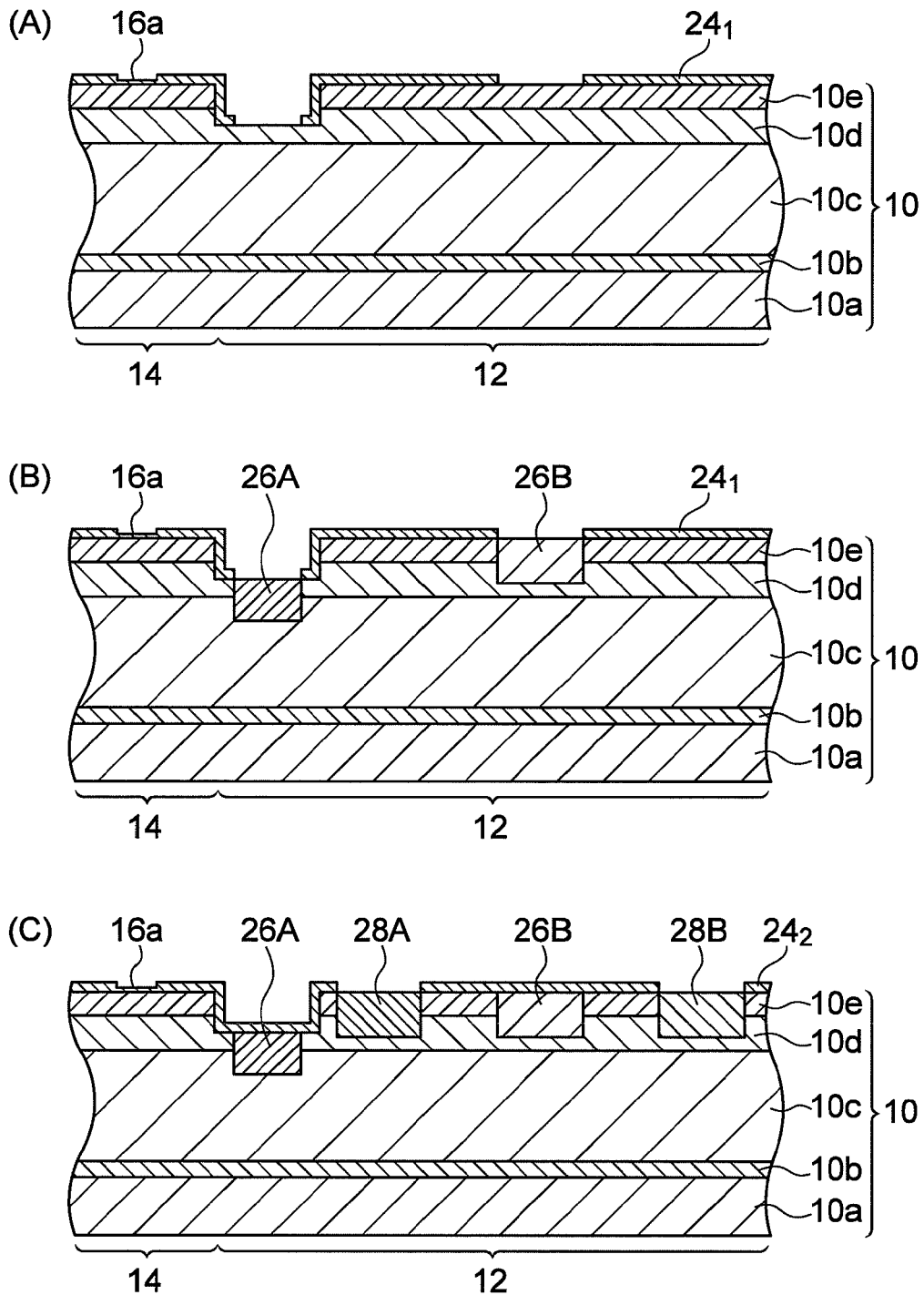
FIG. 7 is a set of diagrams illustrating an example of steps of manufacturing a semiconductor substrate subsequent to those represented in FIG. 6.
Figure 8:
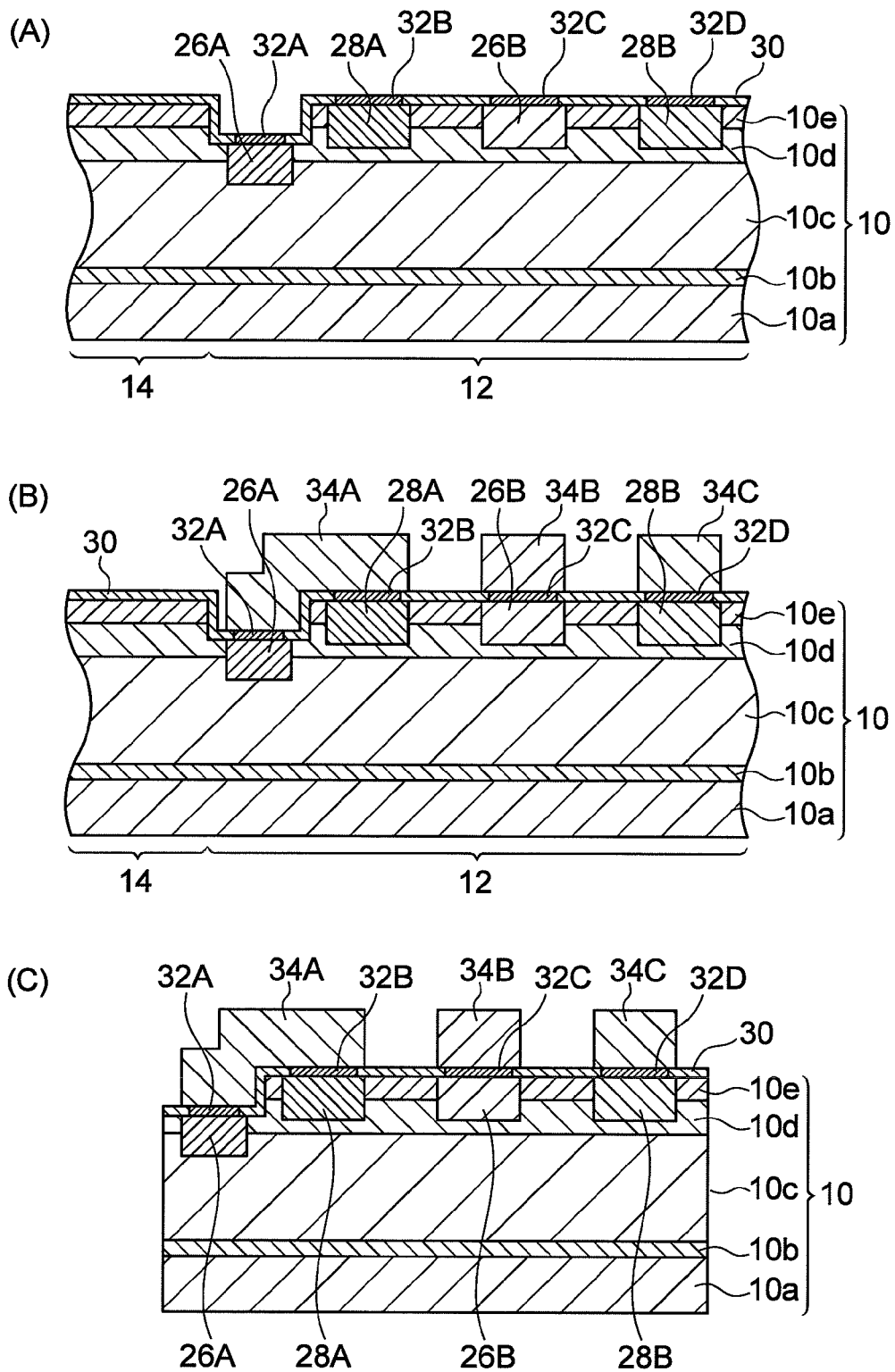
FIG. 8 is a set of diagrams illustrating an example of steps of manufacturing a semiconductor substrate subsequent to those represented in FIG. 7.

FIGS. 6 to 8 are diagrams illustrating steps of a method of manufacturing a semiconductor device. While the method of manufacturing a semiconductor device will be explained with specific examples of materials and the like in the following, the present invention is not limited to the method of manufacturing a semiconductor device utilizing the materials and like exemplified here.

The semiconductor substrate 10 illustrated in FIG. 6(A) is prepared. The semiconductor substrate 10 is a substrate in which a p-type electric field blocking layer 10b, a p$^-$-type depletion layer 10c, an n-type channel layer 10d, and a p-type active layer 10e are epitaxially grown on a p-type 4H-SiC substrate 10a by CVD (chemical vapor deposition). The p-type electric field blocking layer 10b, p$^-$-type depletion layer 10c, n-type channel layer 10d, and p-type active layer 10e are those in which layers constituted by SiC are appropriately doped with impurities for regulating their corresponding conduction types. An example of the thickness of the p-type electric field blocking layer 10b is 0.5 μm. An example of the thickness of the p$^-$-type depletion layer 10c is 10 μm. An example of the thickness of the n-type channel layer 10d is 0.4 μm. An example of the thickness of the p-type active layer 10e is 0.3 μm. The epitaxial growth utilizing the CVD employs a hydrogen gas as a carriage gas, silane ($SiH_4$) as an Si material gas, and propane ($C_3H_8$) as a Carbon material gas. Also employable are nitrogen ($N_2$) as an n-type impurity and diborane ($B_2H_6$) and trimethylaluminum (TMA) as p-type impurities.

As illustrated in FIG. 6(A), the semiconductor substrate 10 has a groove 22 in each device forming region 12. The groove 22 can be formed by etching such as RIE dry etching after producing an etching mask on the semiconductor substrate 10.

Subsequently, as illustrated in FIG. 6(B), a mask film 16 is formed on a surface of the semiconductor substrate 10 on the p-type active layer 10e side. Examples of materials for the mask film 16 and methods of forming the same are as mentioned above and thus will not be explained here.

In the step illustrated in FIG. 7(A), a pattern for implanting p$^+$ ions into the semiconductor substrate 10 is formed in the mask film 16, so as to yield an ion implantation mask member $24_1$. Specifically, a resist film is formed on the mask film 16, and then a mask pattern for ion implantation is produced in the mask film 16 upon exposure to light by employing a stepper, so as to attain the mask member $24_1$.

In the step illustrated in FIG. 7(B), ions are implanted into the semiconductor substrate 10 by employing the mask member $24_1$, so as to form impurity diffusion regions 26A, 26B as p$^+$ ion implantation regions. An example of the ions implanted at the time of forming the p$^+$ ion implantation regions is Al ion. At the time of ion implantation, the semiconductor substrate 10 to be implanted with ions is heated to a temperature of about 300° C. in order to prevent crystallinity from deteriorating.

Thereafter, the mask member $24_1$ is removed once, and then a mask member $24_2$ is made as in the steps illustrated in FIGS. 6(B) and 7(A). Subsequently, impurity diffusion regions 28A, 28B as n$^+$ ion implantation regions are formed as illustrated in FIG. 7(C) as in the step illustrated in FIG. 7(B). An example of the ions implanted at the time of forming the n$^+$ ion implantation regions is P ion.

Next, as illustrated in FIG. 8(A), an oxide film 30 and ohmic electrodes 32A, 32B, 32C, 32D are formed as illustrated in FIG. 8(A). Specifically, the semiconductor substrate 10 is annealed, and then the mask member $24_2$ is removed. Subsequently, the oxide film 30 is formed on the front face of the semiconductor substrate 10, and then the ohmic electrodes 32A, 32B, 32C, 32D, each constituted by nickel (Ni), are formed on the impurity diffusion regions 26A, 26B, 28A, 28B, respectively.

Thereafter, as illustrated in FIG. 8(B), a source electrode pad 34A, a gate electrode pad 34B, a drain electrode pad 34C, and their wiring structures are formed on the ohmic electrodes 32A, 32B, 32C, 32D. The source electrode pad 34A, gate electrode pad 34B, drain electrode pad 34C, and their wiring structures can be formed by vapor-depositing Al on the semiconductor substrate 10, so as to yield an Al film having a thickness of about 1 μm, then producing a protective film only at locations to be wired, and selectively etching the Al film, so as to leave necessary portions alone.

Finally, dicing the semiconductor substrate 10 along the dicing areas 14 completes a semiconductor device as a RESURF JFET illustrated in FIG. 8(C).

The method of manufacturing a semiconductor device explained in the foregoing produces the cutouts 16a in the mask film 16 formed on the semiconductor substrate 10 in the process of manufacturing the semiconductor device. The cutouts 16a inhibit the semiconductor substrate 10 from being deflected by the mask film 16. This point will be explained in the following.

As mentioned above, the mask film 16 (or the film 18 to become the mask film 16) has a coefficient of thermal expansion different from that of the semiconductor substrate 10. Therefore, when the film 18 is cooled to about room temperature after being formed on the semiconductor substrate 10, their difference in coefficient of thermal expansion may cause the semiconductor substrate 10 to deflect.

For example, SiC and GaN which are examples of materials constructing the semiconductor substrate 10 have the following coefficients of thermal expansion:

SiC: about $2.2 \times 10^{-6}$/K
GaN: about $5.6 \times 10^{-6}$/K

On the other hand, materials generally used for constructing the mask film 16 (or film 18) have the following coefficients of thermal expansion:

Tungsten: about $4.5 \times 10^{-6}$/K
Silicon oxide ($SiO_2$): about $0.51 \times 10^{-6}$/K
Silicon nitride: about $2.6 \times 10^{-6}$/K
Polysilicon: about $2.55 \times 10^{-6}$/K (20° C.) to about $4.34 \times 10^{-6}$/K (1000° C.)
Molybdenum: about $5.1 \times 10^{-6}$/K
Tantalum: about $6.3 \times 10^{-6}$/K
Tantalum carbide: about $6 \times 10^{-6}$/K
Aluminum: about $23 \times 10^{-6}$/K
Nickel: about $12.8 \times 10^{-6}$/K
Copper: about $16.8 \times 10^{-6}$/K As mentioned above, the coefficients of thermal expansion of various materials listed as examples of materials for the mask film 16 differ from those of SiC and GaN exemplified as materials for the semiconductor substrate 10. The exemplified materials for the mask film 16 are those generally used as materials for the ion implantation mask during the process of manufacturing a semiconductor device. Therefore, any combination of materials for the semiconductor substrate 10 and general materials for the mask film 16 (or film 18) may cause deflections when the film 18 is formed on the semiconductor substrate 10. The amount of deflections is on the order of 10 μm to 100 μm, for example, but can become greater than about 100 μm as the case may be.

In this embodiment, the mask film 16 has the cutouts, whereby stresses caused by shrinkage of the mask film 16 can be suppressed. This can eliminate the deflections in the semiconductor substrate 10, thereby returning the semiconductor substrate 10 to a substantially flat state.

As exemplified above, the mask film 16 is patterned highly accurately upon exposure to light by using a stepper or the like. Here, since the semiconductor 10 formed with the mask film 16 is flat, the mask film 16 can be patterned more precisely. As a result, the ion implantation regions 26A, 26B, 28A, 28B can be formed with higher accuracy at desirable positions.

In the mask film 16, the cutouts 16a are formed in regions on the dicing areas 14, which are regions on the outside of the device forming regions 12. Therefore, the accuracy required for forming the cutouts 16a is lower than that required when forming the mask pattern for ion implantation. Hence, the cutouts 16a can easily be formed by employing a contact aligner or the like.

Since the cutouts 16a are formed on the dicing areas 14, the size of the device forming regions 12 does not become smaller than that without the cutouts 16a. Therefore, the semiconductor substrate 10 can be utilized effectively while inhibiting the semiconductor substrate 10 from being deflected by the forming of the mask film 16. Forming the cutouts 16a in the dicing areas 14 can also restrain ions from being implanted into the device forming regions 12 through the cutouts 16a at the time of ion implantation and the like. As a result, the manufacturing yield of semiconductor devices can be prevented from deteriorating.

In one embodiment, the width W1 of the cutouts 16a is narrower than the width W2 of the dicing areas 14. In this case, even when ions are implanted from the regions of the cutouts 16a into the semiconductor substrate 10 at the time of ion implantation, such unnecessary ions are hard to be implanted into the device forming regions 12. This can more strongly prevent the manufacturing yield of semiconductor devices from deteriorating.

In one embodiment, the cutouts 16a penetrate through the mask film 16. In this case, the cutouts 16a may be controlled with low accuracy in its depth direction and thus can be formed easily. Further, the cutouts 16a penetrating through the mask film 16 divides the latter into a plurality of regions. This can further suppress stresses caused by differences in coefficient of thermal expansion within the mask film 16. As a result, deflections in the semiconductor substrate 10 can be reduced more effectively.

In one embodiment, each cutout 16a has a length in the depth direction smaller than the thickness of the mask film 16. This shortens the time required for forming the cutouts 16a. Hence, the semiconductor device can be manufactured more efficiently.

While various embodiments of the present invention have been explained in the foregoing, the present invention can be modified in various ways within the scope not deviating from the gist thereof without being restricted to the embodiments illustrated above.

The foregoing explanations set forth the mask film 16 to become a mask for ion implantation as a film formed with the cutouts 16a by way of example. However, the film formed with the cutouts may be any film as long as it is provided for a semiconductor substrate in the process of manufacturing a semiconductor device and has a coefficient of thermal expansion different from that of the semiconductor substrate 10.

For example, the forming of wiring pads referring to FIG. 7(C) illustrates a method of forming a film constituted by Al on a semiconductor substrate and then patterning the Al film so as to form pads or wiring. A film used for forming pads, wiring, and the like in such a semiconductor device may be formed with cutouts. A film to become a mask member at the time of epitaxial growth in the process of manufacturing a semiconductor device may also be formed with cutouts.

Thus, the film formed with cutouts is not limited to the mask film to become a mask for ion implantation. However, forming cutouts in a film which is likely to cause deflections in the semiconductor substrate or a film whose deflections affect the manufacturing process over performances of the semiconductor device is effective from the viewpoint of efficiently manufacturing the semiconductor device. From such a viewpoint, forming cutouts in a mask film for ion implantation, a film for forming wiring, or a film for forming pads is more effective. Forming a film with cutouts is effective when the ratio in coefficient of thermal expansion between the film and the semiconductor substrate is at least 1.3 or not greater than 1/1.3, more preferably at least 2 or not greater than ½, from the viewpoint that the deflections are more likely to occur in the semiconductor substrate. Forming a film with cutouts is also effective when the semiconductor substrate has a thickness of 500 µm or less, since the film is more likely to affect it.

Since it is sufficient for the film formed with the cutouts to have a coefficient of thermal expansion different from that of the semiconductor substrate, materials for the film are not limited to those exemplified in the foregoing. The film may be made of diamond, for example. When a deflection affecting the manufacturing of the device occurs in the semiconductor substrate according to the difference in coefficient of thermal expansion between the semiconductor substrate and the film formed on the semiconductor substrate, the semiconductor substrate 10 may be made of Si.

The explanations referring to FIG. 4 exemplify a mode which deposits a film and then forms cutouts in the deposited film. However, a film provided with cutouts may directly be formed on the semiconductor substrate 10 by a liftoff process, for example.

What is claimed is:

1. A method of manufacturing a semiconductor device comprising the steps of:
    forming a film on a main face of a semiconductor substrate having a plurality of device forming regions for forming semiconductor devices, the film having a coefficient of thermal expansion different from that of the semiconductor substrate and including a cutout on a region between the plurality of device forming regions;
    forming the semiconductor devices in the respective device forming regions by using the film; and
    dividing the semiconductor substrate into the respective device forming regions,
    wherein the film is a film to become a mask member for implanting an ion into the semiconductor substrate.

2. The method of manufacturing a semiconductor device according to claim 1, wherein the step of dividing the semiconductor substrate into the respective device forming regions uses an area between the adjacent device forming regions as a dicing area so as to dice the semiconductor device into the respective device forming regions; and
    wherein the cutout is formed along the dicing area.

3. The method of manufacturing a semiconductor device according to claim 2, wherein the cutout is located on the dicing area; and
    wherein the cutout has a width smaller than that of the dicing area in a cross section orthogonal to an extending direction of the dicing area.

4. The method of manufacturing a semiconductor device according to claim 1, wherein the cutout penetrates through the film in a thickness direction thereof.

5. The method of manufacturing a semiconductor device according to claim 1, wherein the cutout has a length in a depth direction thereof smaller than a thickness of the film.

6. The method of manufacturing a semiconductor device according to claim 1, wherein the step of forming the film has the steps of:
    depositing the film on the main face of the semiconductor substrate and
    forming the cutout in the deposited film.

* * * * *